(12) United States Patent
Manabe et al.

(10) Patent No.: US 9,007,504 B2
(45) Date of Patent: Apr. 14, 2015

(54) METHOD, APPARATUS AND SYSTEM FOR REDUCING PIXEL CELL NOISE

(75) Inventors: Sohei Manabe, San Jose, CA (US); Jeong-Ho Lyu, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 398 days.

(21) Appl. No.: 13/441,697

(22) Filed: Apr. 6, 2012

(65) Prior Publication Data
US 2013/0265472 A1 Oct. 10, 2013

(51) Int. Cl.
*H04N 5/335* (2011.01)
*H01L 27/146* (2006.01)

(52) U.S. Cl.
CPC .... *H01L 27/14609* (2013.01); *H01L 27/14632* (2013.01); *H01L 27/14636* (2013.01); *H01L 27/1464* (2013.01)

(58) Field of Classification Search
CPC ............................. H01L 27/1464; H04N 5/369
See application file for complete search history.

(56) References Cited

U.S. PATENT DOCUMENTS

2011/0249163 A1* 10/2011 Ikeda et al. ................... 348/308
2013/0221194 A1*  8/2013 Manabe ..................... 250/208.1

FOREIGN PATENT DOCUMENTS

| TW | I353174 B | 11/2011 |
| TW | I353774 B | 12/2011 |
| TW | I354490 B | 12/2011 |
| TW | I355196 B | 12/2011 |

OTHER PUBLICATIONS

TW 102111962—First ROC (Taiwan) Office Action and Search Report with English Translation, issued Jan. 12, 2015 (6 pages).

* cited by examiner

*Primary Examiner* — Gary C Vieaux
(74) *Attorney, Agent, or Firm* — Blakely Sokoloff Taylor & Zafman LLP

(57) ABSTRACT

Circuitry to reduce signal noise characteristics in an image sensor. In an embodiment, a bit trace line segment is located between neighboring respective segments of a source follower power trace and an additional trace which is to remain at a first voltage level during a pixel cell readout time period. In another embodiment, for each such trace segment, a smallest separation between the trace segment and the respective neighboring other one of such trace segments is substantially equal to or less than some maximum length to provide for parasitic capacitance between the bit line trace and one or more other traces.

9 Claims, 6 Drawing Sheets

METHOD, APPARATUS AND SYSTEM FOR REDUCING PIXEL CELL NOISE

BACKGROUND

1. Technical Field

This disclosure relates generally to image sensors, and in particular but not exclusively, relates to CMOS image sensors.

2. Background Art

Image sensors have become ubiquitous. They are widely used in digital still cameras, cellular phones, security cameras, as well as medical, automobile, and other applications. The demands of higher resolution and lower power consumption have encouraged further miniaturization and integration of these image sensors. As a result, technology used to manufacture image sensors, for example, CMOS image sensors ("CIS"), has continued to advance at a great pace.

FIG. 1 is a circuit diagram showing pixel circuitry 100 including two four-transistor ("4T") pixel cells—Pa 110a and Pb 110b—of a conventional pixel array. In FIG. 1, pixel cells Pa 110a and Pb 110b are arranged in two rows and one column. Pa 110a and Pb 110b each include the same conventional pixel cell architecture in which each pixel cell includes a photosensitive element PD, a transfer transistor T1, a reset transistor T2, a source-follower ("SF") transistor T3, and a select transistor T4.

During operation of Pa 110a, transfer transistor T1 receives transfer signal TXa, which transfers charge accumulated in PD to floating diffusion node FD. T2 is coupled between reset power supply RVDDa and FD to reset the pixel (e.g., to discharge or charge FD and/or PD to a preset voltage) under control of reset signal RSTa. FD is also coupled to control the gate of T3. T3 is coupled between source follower power supply SVDD and T4. T3 operates as a source-follower providing a high impedance connection to FD. Under control of select signal SELa, T4 selectively provides an output of pixel cell Pa 110a to readout column bit line BL. Similar operation of pixel cell 110b is achieved with a corresponding transfer signal TXb, reset power supply RVDDb, reset signal RSTb and select signal SELb.

In pixel cell 110a, PD and FD are reset by temporarily asserting reset signal RSTa and transfer signal TXa. An image accumulation window (exposure period) is commenced by de-asserting transfer signal TXa and permitting incident light to charge PD. As photo-generated electrons accumulate on PD, its voltage decreases. The voltage or charge on PD is indicative of the intensity of the light incident on PD during the exposure period. At the end of the exposure period, reset signal RSTa is de-asserted to isolate FD and transfer signal TXa is asserted to allow an exchange of charge between PD and FD, and hence the gate of T3. The charge transfer causes the voltage of FD to change by an amount which is proportional to photogenerated electrons accumulated on PD during the exposure period. This second voltage biases T3 which, in combination with select signal SELa being asserted, drives a signal from T4 to the readout column line. Data is then read-out from pixel cell Pa 110a onto readout column bit line BL as an analog signal.

Generally speaking, miniaturization in image sensors results in smaller photodiodes which generate smaller amounts of charge for smaller amounts of incident light, where signals of smaller voltage and/or current levels are in turn generated for representation of the captured image. Such smaller signals are more susceptible to various types of noise.

Pixel readout noise depends upon a frequency bandwidth of bit line BL. Current techniques to address pixel readout noise include providing a large sample hold capacitance in a correlated double sampling (CDS) circuit (not shown) which is coupled for a differential sampling of bit line BL. Larger sample hold capacitance results in narrower frequency bandwidth characteristics for signaling on bit line BL, which in turn reduces signal noise. However, implementing such a larger sample hold capacitance requires image sensor circuitry to have a larger die size.

Another solution for reducing pixel readout noise is to provide a large gate size for source follower transistor T3. A larger SF gate size provides for better signal-to-noise characteristics, as compared to a smaller SF gate size. However, large SF gate size typically comes at the cost of photodiode size, which degrades sensitivity and full-well capacity of the photodiode. These and other current techniques to improve pixel noise generally have prohibitive trade-offs in terms of image sensor size.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Embodiments discussed herein variously provide techniques and mechanisms for reducing signal noise in image sensor circuitry. Such circuitry may include or otherwise provide for operation of a pixel array including a pixel cell having a source follower to provide an amplification signal. An output signal of the pixel cell may, for example, be based on such an amplification signal.

In an embodiment, circuitry to operate such a pixel cell includes a bit line trace coupled to receive an output signal of the pixel cell, and a source follower power trace coupled to the pixel cell to directly or indirectly power the source follower transistor. Certain embodiments variously provide an arrangement of circuitry for increased capacitance between such a bit line trace and one or more other traces. By way of illustration and not limitation, such an arrangement of circuitry may include respective segments of the above-described bit line trace and source follower power trace, and also of an additional trace which is to remain at a particular voltage level while the pixel cell provides an output signal to the bit line trace.

To reduce pixel readout signal noise, the respective segments of the bit line trace, source follower power trace and additional trace may extend in parallel with one another. By way of illustration and not limitation, the bit trace line segment may be located between neighboring respective segments of the source follower power trace and the additional trace. Such respective segments may, for example, extend along a direction of a column of pixels in a pixel array which is configured to provide output signals on a pixel row basis. Some or all of such segments may extend over a pixel cell from which the bit line trace is to receive an output signal, although certain embodiments are not limited in this regard.

In one embodiment, for each of such respective segments of the bit line trace, source follower power trace and additional trace, a smallest separation between the segment and a respective neighboring other one of the segments is substantially equal to or less than some maximum distance—e.g. 0.2 micrometers. Additionally or alternatively, a smallest separation between the additional trace segment and the bit line trace segment may be substantially equal to a width of the additional trace segment. Additionally or alternatively, a smallest separation between the bit line trace segment and the source follower power trace segment may be substantially equal to a width of the source follower power trace segment. Additionally or alternatively, the smallest separation between the additional trace segment and the bit line trace segment may be substantially equal to the smallest separation between the bit line trace segment and the source follower power trace segment.

Figure 1:
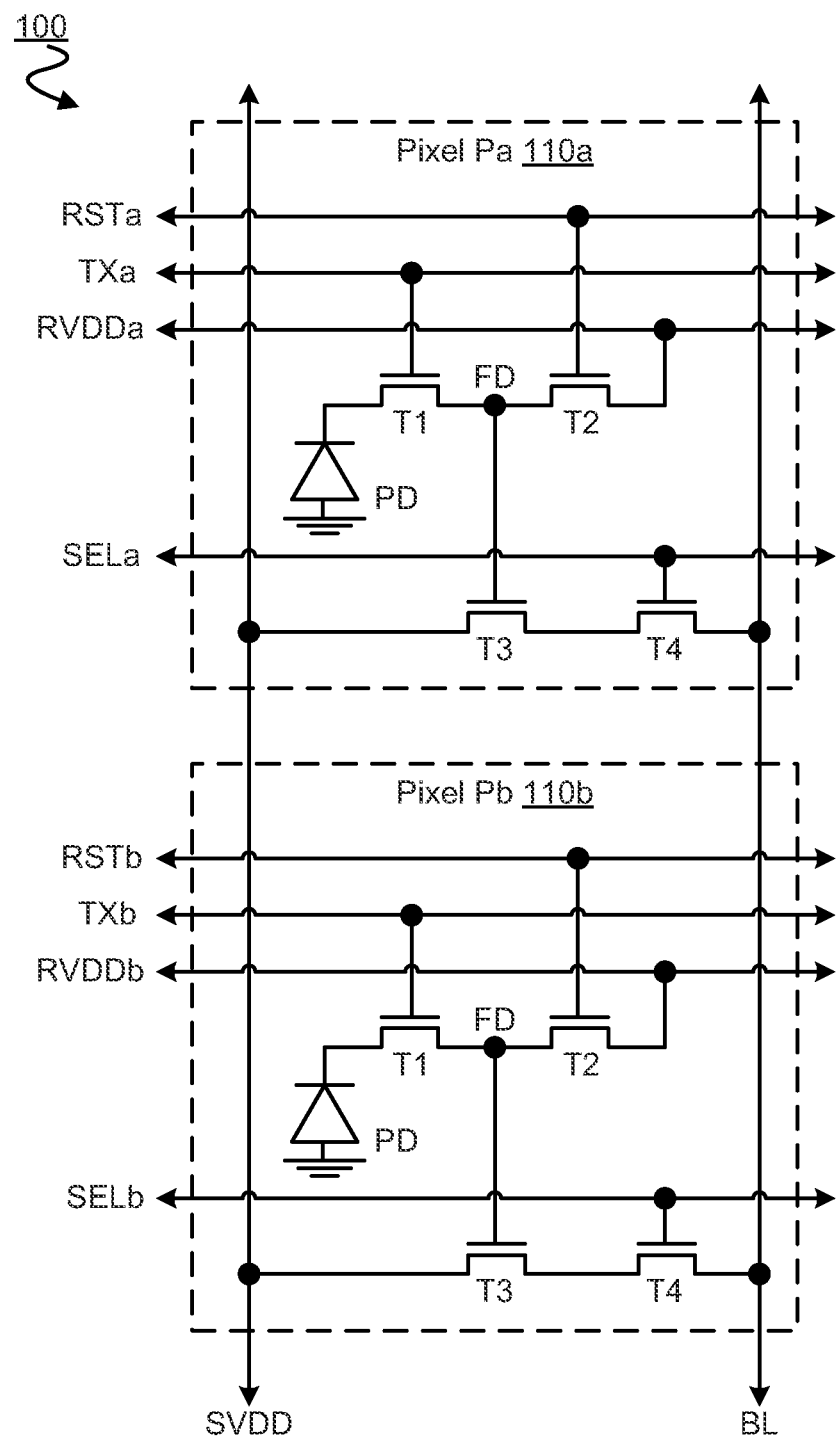
FIG. 1 is a circuit diagram illustrating pixel circuitry of two 4T pixels in a conventional image sensor.
Figure 2:
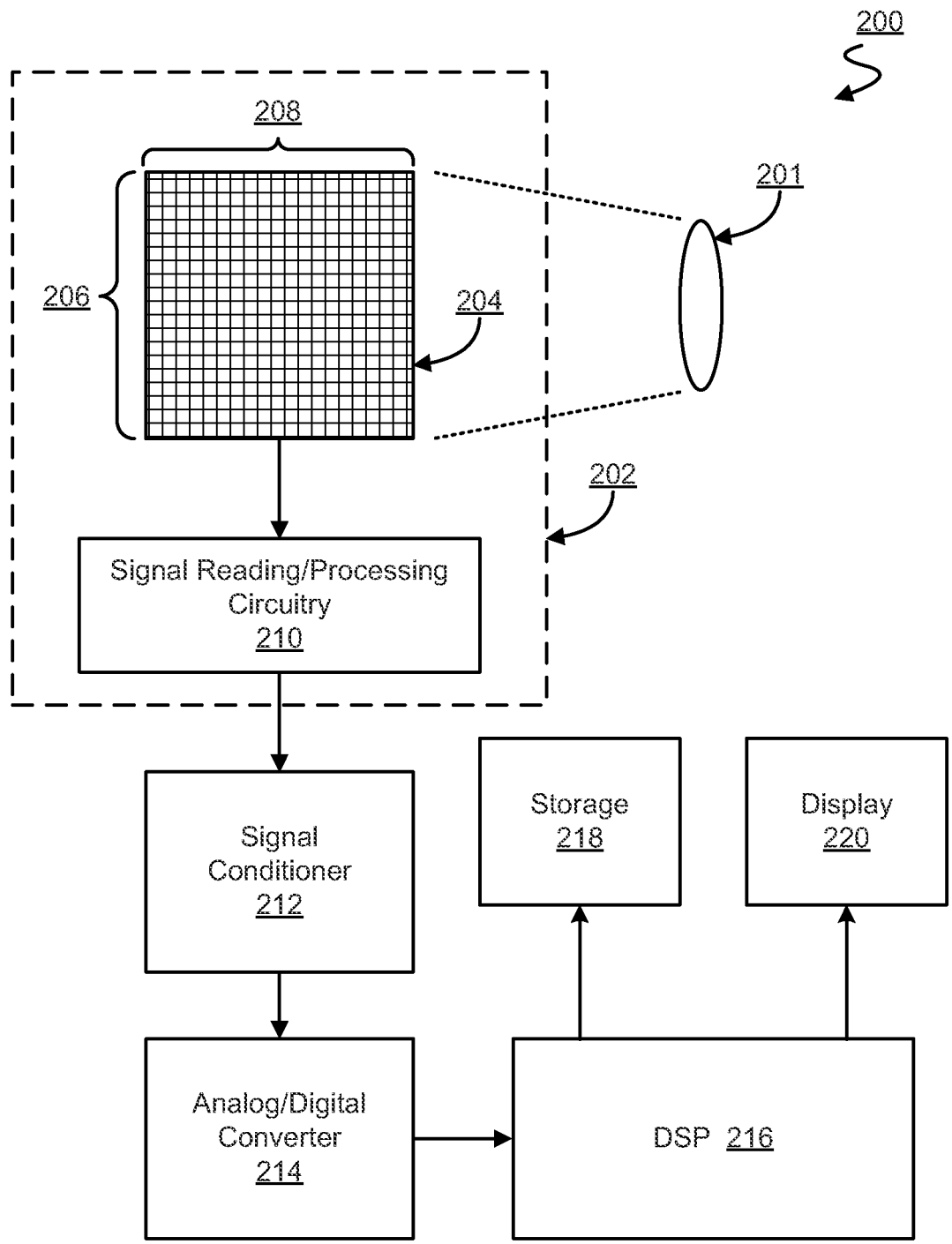
FIG. 2 is a block diagram illustrating elements of an image sensor system according to an embodiment.

FIG. 2 illustrates elements of an imaging system 200 according to an embodiment. Optics 201, which can include refractive, diffractive or reflective optics or combinations of these, may couple to image sensor 202 to focus an image onto the pixels in pixel array 204 of the image sensor. Pixel array 204 may capture the image and the remainder of imaging system 200 may process the pixel data from the image. By way of illustration and not limitation, image sensor 202 may comprise pixel array 204 and signal reading and processing circuitry 210. Image sensor 202 may, for example, include pixel array 204 comprising a plurality of pixels arranged in rows 206 and columns 208. During operation of pixel array 204 to capture an image, one or more pixels in pixel array 204 may capture incident light (i.e., photons) during a certain exposure period and convert the collected photons into an electrical charge. The electrical charge generated by each pixel may be read out as an analog signal—e.g. where a characteristic of the analog signal such as its charge, voltage or current is representative of the intensity of light that was incident on the pixel during the exposure period. Illustrated pixel array 204 is regularly shaped, but in other embodiments the array may have a regular or irregular arrangement different than shown and can include more or less pixels, rows, and columns than shown. Moreover, in different embodiments pixel array 204 may be a color image sensor including red, green, and blue pixels designed to capture images in the visible portion of the spectrum, or may be a black-and-white image sensor and/or an image sensor designed to capture images in the invisible portion of the spectrum, such as infrared or ultraviolet.

In an embodiment, image sensor 202 includes signal reading and processing circuitry 210. Among other things, signal reading and processing circuitry 210 may include circuitry and logic that methodically reads analog signals from each pixel, filters these signals, corrects for defective pixels, and so forth. In an embodiment where signal reading and processing circuitry 210 performs only some reading and processing functions, the remainder of the functions may be performed by one or more other components such as signal conditioner 212 or digital signal processor (DSP) 216. Although shown in FIG. 2 as an element separate from pixel array 204, in some embodiments signal reading and processing circuitry 210 may be integrated with pixel array 204 on the same substrate or may comprise circuitry and logic embedded within the pixel array. In other embodiments, however, signal reading and processing circuitry 210 is an element external to pixel array 204 as shown in FIG. 2. In still other embodiments, some or all of signal reading and processing circuitry 210 may be not only external to pixel array 204, but also external to image sensor 202. In an embodiment, signal reading and processing circuitry 210 includes an arrangement of one or more elements to reduce signal noise. For example, signal reading and processing circuitry 210 may include an arrangement of elements to provide for increased capacitance between a bit line trace and one or more other traces of image sensor 202—e.g. where the capacitance is to narrow frequency bandwidth characteristics of signaling on the bit line trace.

Signal conditioner 212 may be coupled to image sensor 202 to receive and condition analog signals from pixel array 204 and signal reading and processing circuitry 210. In different embodiments, signal conditioner 212 may include various components for conditioning analog signals. Examples of components that may be found in the signal conditioner include filters, amplifiers, offset circuits, automatic gain control, etc. In an embodiment where signal conditioner 212 includes only some of these elements and performs only some conditioning functions, the remaining functions may be performed by one or more other components such as signal reading and processing circuitry 210 or DSP 216. Analog-to-digital converter (ADC) 214 may be coupled to signal conditioner 212 to receive conditioned analog signals corresponding to each pixel in pixel array 204 from signal conditioner 212 and convert these analog signals into digital values.

DSP 216 may be coupled to ADC 214 to receive digitized pixel data from ADC 214 and process the digital data to produce a final digital image. DSP 216 may include a processor and an internal memory in which it may store and retrieve data. After the image is processed by DSP 216, it may be output to one or both of storage unit 218 such as a flash memory or an optical or magnetic storage unit and display unit 220 such as an LCD screen.

Figure 3:
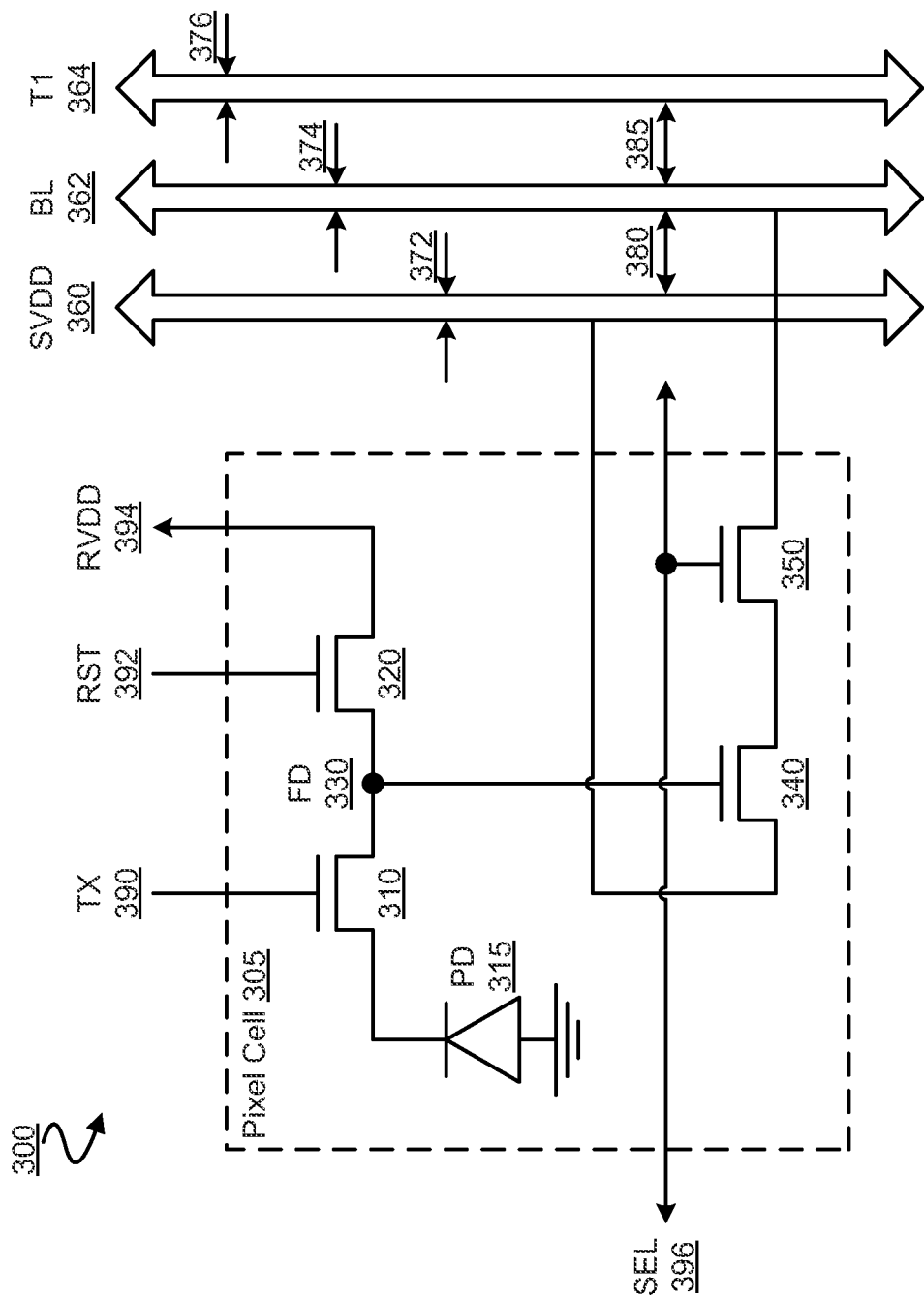
FIG. 3 is a circuit diagram illustrating elements of an image sensor according to an embodiment.

FIG. 3 is a circuit diagram showing elements of image sensor 300 including pixel cell 305 of a larger pixel array (not shown) and various traces for operation of pixel cell 305 according to an embodiment. The pixel array may include some or all of the features of pixel array 204, for example. Pixel cell 305 may be arranged to provide an output to readout bit line BL 362, although certain embodiments are not limited in this regard. In an embodiment the illustrative pixel cell 305 includes photosensitive element PD 315, transfer transistor 310, reset transistor 320, source follower transistor 340 and select transistor 350. However, pixel cell 305 may include any of a variety of alternative pixel cell architectures, according to different embodiments, in which some source follower transistor is to provide an amplification signal for determining on which an output signal of the pixel cell is based.

During operation of pixel cell 305, transfer transistor 310 may receive a transfer signal TX 390, which transfers charge accumulated in PD 315 to floating diffusion node FD 330. Reset transistor 320 may be coupled between reset power supply RVDD 394 and FD 330 to reset the pixel (e.g., to discharge or charge FD 330 and/or PD 315 to a preset voltage) under control of reset signal RST 392. FD 330 may also be coupled to control the gate of source follower transistor 340. Source follower transistor 340 may be coupled between source follower power trace SVDD 360 and select transistor 350. Source follower transistor 340 may operate as a source-follower providing a high impedance connection to FD 330.

In an embodiment, source follower transistor 340 provides an amplification signal which is received by select transistor 350. Select transistor 350 may, under control of select signal SEL 396, selectively receive the amplification signal and provide an output of pixel cell 305 to BL 362. In an alternate embodiment, a pixel cell does not include any select transistor—e.g. where the amplification signal from a source follower transistor such as transistor 340 is provided directly to a readout bit line. In such an alternate embodiment, the amplification signal may itself be the analog output signal of the pixel cell.

PD 315 and FD 330 may be reset by temporarily asserting reset signal RST 392 and transfer signal TX 390. An image accumulation window (exposure period) may be commenced by de-asserting transfer signal TX 390 and permitting incident light to charge PD 315. As photo-generated electrons accumulate on PD 315, its voltage may decrease. The voltage or charge on PD 315 may be indicative of the intensity of the light incident on PD 315 during the exposure period. At the end of the exposure period, reset signal RST 392 may be de-asserted to isolate FD 330 and transfer signal TX 390 may be asserted to allow an exchange of charge between PD 315 and FD 330, and hence to the gate of source follower transistor 340. The charge transfer causes the voltage of FD 330 to change by an amount which is proportional to photogenerated electrons accumulated on PD 315 during the exposure period. This second voltage biases source follower transistor 340 which, in combination with select signal SEL 396 being asserted, may drive a signal from select transistor 350 to BL 362. Data may then be readout from pixel cell 305 onto bit line BL 362 as an analog output signal.

To reduce pixel readout signal noise, certain embodiments variously provide an arrangement of elements in image sensor 300 to increase parasitic capacitance between BL 362 and one or more other traces. By way of illustration and not limitation, image sensor 300 may include first trace T1 364, some segment of which is to remain at a particular voltage level at least throughout a time period during which BL 362 receives an output signal from pixel cell 305. T1 364 may be a "dummy trace" in certain embodiments—e.g. where T1 364 does not directly power or otherwise activate any pixel cell of image sensor 300. In an embodiment, T1 364 is coupled to a ground voltage, for example. In another embodiment, T1 364 is coupled to a power supply (e.g. SVDD 360 or RVDD 394), where a voltage level of such a power supply is to remain the same while an output signal is provided from pixel cell 305. For example, T1 364 may remain at the particular voltage level in the absence of any control mechanism explicitly signaling—e.g. at least during the reading of an output signal from pixel cell 305—that the voltage of T1 364 is to be changed.

The illustrative embodiment of FIG. 3 shows a first segment of T1 364 and a second segment of BL 362 in a region of image sensor 300 where no other trace is positioned between T1 364 and BL 362. Accordingly, T1 364 and BL 362 may be said to neighbor one another—e.g. at least due to the arrangement shown in the illustrated region of image sensor 300. Such a first segment of T1 364 may extend in parallel to the second segment of BL 362. In turn, that same second segment of BL 362 may neighbor, and extend in parallel to, the illustrated third segment of SVDD 360 which neighbors the second segment of BL 362.

The illustrative segments of SVDD 360, BL 362 and T1 364 are not shown to scale, and may vary in different embodiments at least according to their respective widths and/or their various separations from one another. In an embodiment, the segments of SVDD 360, BL 362 and T1 364 shown in FIG. 3 extend along one direction (e.g. column-wise) of a pixel array which is configured to concurrently provide respective output signals from pixels along another direction (e.g. row-wise). Some or all of TX 390, RST 392, RVDD 394 may extend perpendicular to SVDD 360, BL 362 and T1 364, although certain embodiments are not limited in this regard.

The arrangement of elements to increase parasitic capacitance of BL 362 may include each of the above-described first segment, second segment and third segment being substantially within a maximum distance of a respective neighboring other one of the first segment, second segment and third segment. In one embodiment, a maximum distance may be a value which is independent of some or all dimensions of image sensor circuitry. By way of illustration and not limitation, for each of the first segment, the second segment and the third segment, the segment in question may be substantially within 0.2 micrometers of the respective neighboring other one of the first segment, the second segment and the third segment. For example, a smallest distance 380 between the respective segments of SVDD 360 and BL 362 may be substantially no greater than 0.2 micrometers, and a smallest distance 385 between the respective segments of BL 362 and T1 364 may be substantially no greater than 0.2 micrometers. As referred to herein, "substantially within a maximum distance" refers to the possibility of up to a ±10% variance in the distance—e.g. ±0.02 microns for a 0.2 micron maximum distance.

In one embodiment, a maximum distance may be a relative value which is based upon one or more dimensions of image sensor 300. By way of illustration and not limitation, the smallest distance 385 between the first segment of T1 364 and the second segment of BL 362 may be substantially equal to width 376 of the first segment. In this context, "width" refers to a dimension of a trace as measured along a line of minimum separation between a segment of that trace and some other trace. Alternatively or in addition, the smallest distance 380 between the second segment of BL 362 and the third segment of SVDD 360 may be substantially equal to a width 372 of the third segment. In an embodiment, distances 380, 385 are substantially equal to one another—e.g. where widths 372, 376 are substantially equal to one another. Additionally or alternatively, widths 372, 374 and 376 may all be substantially equal to one another, although certain embodiments are not limited in this regard. Accordingly, in certain embodiments, the smallest separation 385 between the first segment of T1 364 and the second segment of BL 362 is substantially equal to each of the width 376 of the first segment of T1 364, the smallest separation 380 between the second segment of BL 362 and the third segment of SVDD 360, and the width 372 of the third segment of SVDD 360. In some embodiments, one or each of separations 380, 385 and widths 372, 372, 376 is substantially equal to the width 374 of the second segment of BL 362. With respect to a width of a particular trace (or to a distance between two particular traces), the phrase "substantially equal to," as used herein, refers to a possibility of up to a ±10% variance in such width (or distance).

Figure 4:
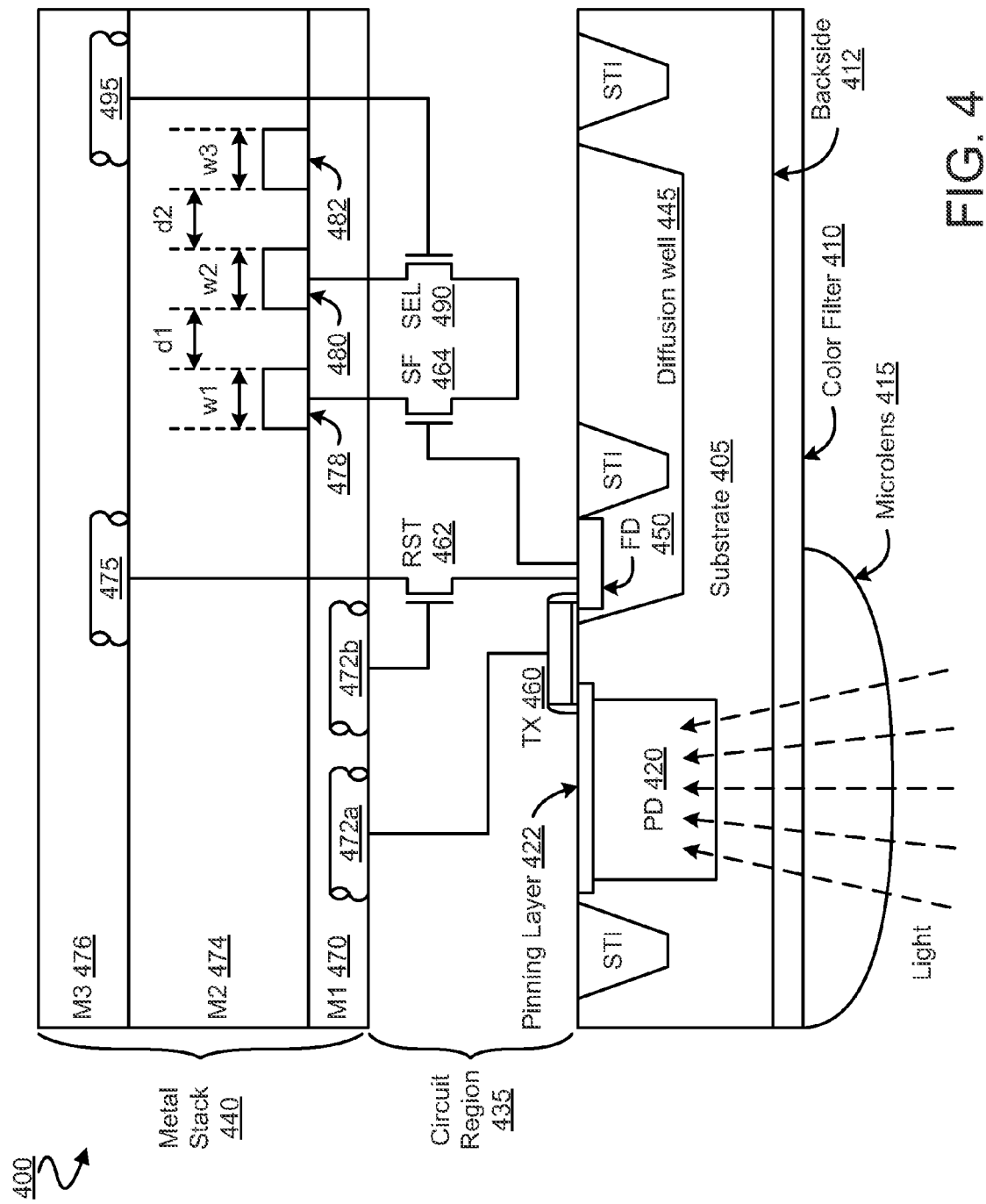
FIG. 4 is a hybrid cross-sectional/circuit diagram illustrating elements of an image sensor according to an embodiment.

FIG. 4 is a hybrid cross-sectional/circuit diagram illustrating elements of a backside illumination (BSI) image sensor 400 in accordance with one embodiment. Other embodiments may be variously implemented for a front side illumination (FSI) image sensor, for example. To illustrate features of various embodiments, FIG. 4 shows both an example of an arrangement of circuit element of a pixel cell and metal stack 440 having various signal lines to provide respective signals to at least that pixel cell. Image sensor 400 may be one possible implementation of image sensor 202, for example. Image sensor 400 may include some or all of the features of image sensor 300, although certain embodiments are not limited in this regard.

Image sensor 400 may include substrate 405 of semiconductor material having formed therein photodiode region PD 420 of the pixel cell, where PD 420 is to accumulate charge in response to light incident upon PD 420. PD 420 may receive such light via a path through backside 412 of substrate 405—e.g. where the light also passes through microlens 415 and/or color filter 410 of image sensor 400. Passivation or pinning layer 422 may be disposed over PD 420 in substrate 405, although certain embodiments are not limited in this regard. Formation of one or more of PD 420, microlens 415 and color filter 410 may be according to any of a variety of known fabrication techniques.

Image sensor 400 may further include one or more other elements of the pixel cell variously formed in or on substrate 405. By way of illustration and not limitation, substrate 405 may have floating diffusion node FD 450—e.g. disposed in diffusion well 445 within substrate 405. In an embodiment, functionality of FD 450 in the operation of image sensor 400 corresponds to functionality of FD 330. In an embodiment, one or more shallow trench isolations ("STI") may be formed in substrate 405 to variously isolate certain elements of the pixel cell from one another and/or from any adjacent pixel (not illustrated).

In one embodiment, substrate 405 is doped with P-type dopants. In this case, substrate 405 and the epitaxial layers grown thereon may be referred to as a P substrate. In a P-type substrate embodiment, diffusion well 445 is a P+ well implant while PD 420 and FD 450 are N-type doped. FD 450 may be doped with an opposite conductivity type dopant, as compared to that of diffusion well 445, to generate a p-n junction within diffusion well 445, thereby electrically isolating floating diffusion 450. In an embodiment where substrate 405 and the epitaxial layers thereon are N-type, diffusion well 445 may be N-type doped, while PD 420 and FD 450 have an opposite P-type conductivity.

Substrate may include transfer transistor TX 460 disposed over a portion of substrate 405 which is between PD 420 and FD 450—e.g. wherein functionality of TX 460 in the operation of the pixel cell corresponds to functionality of transfer transistor 310. For example, a gate of TX 460 may be coupled to a transfer signal line for selectively transferring charge from PD 420 to FD 450. One example of such a transfer signal line is represented by trace 472a in metal layer M1 470 of metal stack 440.

The pixel cell shown in FIG. 4 may include one or more other pixel elements for operation with some or all of PD 420, TX 460 and FD 450. In order to avoid obscuring certain features of various elements, some elements are shown as residing in circuit region 435 positioned between substrate 405 and metal stack 440. Forming such circuit elements in an overlapping configuration with photodiode region 420 and/or other elements disposed in substrate 405 may, for example, improve the efficient use of valuable die real estate. However, in an alternate embodiment, some or all of the circuit elements shown in circuit region 435 may be variously formed in or directly on substrate 405—e.g. where metal stack 440 is directly in contact with substrate 405 and/or with circuit elements disposed directly on substrate 405.

In an embodiment, the pixel cell includes reset transistor RST 462 coupled between FD 450 and a reset power line. One example of such a reset power line is represented by trace 475 in metal layer M3 476 of metal stack 440. Functionality of RST 462 in the operation of image sensor 400 may, for example, correspond to functionality of reset transistor 320. For example, a gate of RST 462 may couple to a reset signal line which provides a signal for selectively resetting a voltage of FD 450. One example of such a reset signal line is represented by trace 472b in metal layer M1 470.

In an embodiment, the pixel cell includes source follower transistor SF 464 coupled between a source follower power line and a bit line for receiving an output signal of the pixel cell. One example of such a source follower power line is represented by trace 478 in metal layer M2 474 of metal stack 440. One example of such a bit line is represented by trace 480 in metal layer M2 474. Functionality of SF 464 in the operation of image sensor 400 may, for example, correspond to functionality of transistor 340. For example, a gate of SF 464 may couple to FD 450 for operation of SF 464 to provide an amplification signal.

In one embodiment, the pixel cell includes row select (or alternatively, column select) transistor SEL 490 (which is shown in an inverted orientation in FIG. 4), where SF 464 is coupled to bit line trace 480 via SEL 490. In such an embodiment, SEL 490 may, under control of a select signal, selectively provide to bit line trace 480 an output signal for the pixel cell which is based on the amplification signal from SF 464. One example of a line for such a select signal is represented by trace 495 in metal layer M3 476. In an alternate embodiment, the pixel cell does not include a select transistor such as SEL 490—e.g. where SF 464 is coupled to provide an amplification signal directly to bit line 480 as an output analog signal of the pixel cell.

For the purpose of illustrating features of certain embodiments the transfer signal line, reset signal line, reset power line, source follower power line and bit line for operation of the pixel cell shown in image sensor 400 are represented by traces 472a, 472b, 475, 478 and 480, respectively. Moreover, traces 472a, 472b and 475 are shown extending in one direction in metal stack 440—e.g. in a row-wise direction—while traces 478, 480 are shown in cross-section as extending in a perpendicular direction in metal stack 440. However, the various respective metal layers and the various respective directions of traces 472a, 472b, 475, 478 and 480 are merely illustrative of one embodiment. For example, certain embodiments may vary, consistent with various features discussed herein, with respect to the particular metal layer of a given signal line, the direction in which a given signal line extends within in a particular metal layer and/or whether a given signal line shares a metal layer with some other signal line. By way of illustration and not limitation, the segments of traces 478, 480, 482 shown in FIG. 3 may, in another embodiment, be in different respective metal layers of a metal stack—e.g. where such segments are aligned with one another on adjacent metal layers.

To reduce pixel readout signal noise, certain embodiments variously provide an arrangement of elements to increase parasitic capacitance between bit line trace 480 and one or more traces which neighbor bit line trace 480. By way of illustration and not limitation, image sensor 400 may further include a first trace 482, some first segment of which is to remain at a particular voltage level at least throughout a time period during which bit line trace 480 receives an output signal from the pixel cell. Such a first segment of trace 482 may neighbor, and extend in parallel to, a second segment of bit line trace 480. In turn, that same second segment of bit line trace 480 may neighbor, and extend in parallel to, some third segment of source follower power trace 478.

The arrangement of elements to increase parasitic capacitance of bit line trace 480 may include each of the above-described first segment, second segment and third segment being substantially within a maximum distance of a respective neighboring other one of the first segment, second segment and third segment. In one embodiment, for each of the first segment, the second segment and the third segment, the segment in question may be substantially within 0.2 micrometers of a respective neighboring other one of the first segment, the second segment and the third segment. For example, a smallest distance d1 between the respective segments of source follower power trace 478 and bit line trace 480 may be substantially no greater than 0.2 micrometers, and a smallest distance d2 between the respective segments of bit line trace 480 and first trace 482 may be substantially no greater than 0.2 micrometers.

In one embodiment, a maximum distance may be a relative value which is based upon one or more dimensions of the image sensor. By way of illustration and not limitation, the smallest distance d2 between the first segment of first trace 482 and the second segment of bit line trace 480 may be substantially equal to a width w3 of the first segment. Alternatively or in addition, the smallest distance d1 between the second segment of bit line trace 480 and the third segment of source follower power trace 478 may be substantially equal to a width w1 of the third segment. In an embodiment, the distances d1, d2 are substantially equal to one another—e.g. where the widths w1, w3 are substantially equal to one another. Additionally or alternatively, widths w1, w2 and w3 may all be substantially equal to one another, although certain embodiments are not limited in this regard.

Figure 5:
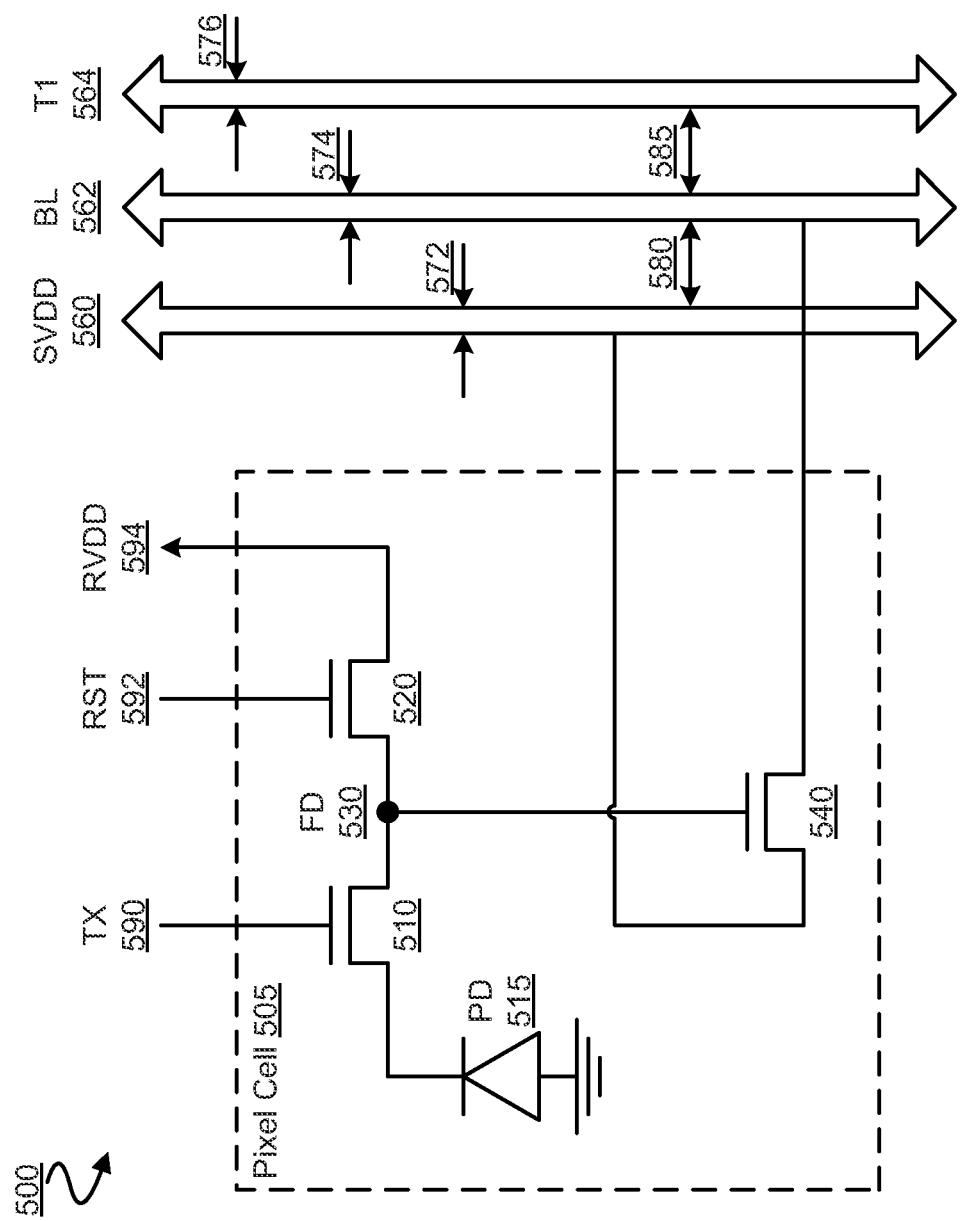
FIG. 5 is a circuit diagram illustrating elements of an image sensor according to an embodiment.

FIG. 5 is a circuit diagram showing elements of image sensor 500 including pixel cell 505 and various traces for operation of pixel cell 505 according to an embodiment. In FIG. 5, pixel cell 505 may, for example, be arranged to provide an output to readout bit line BL 562. In an embodiment the illustrative pixel cell 505 includes photosensitive element PD 515, transfer transistor 510, reset transistor 520, and source follower transistor 540. Transfer signal TX 590 may operate transfer transistor 510 and/or reset signal RST 592 may operate reset transistor 520, e.g. for reset transistor 520 to conduct a signal driven by reset power supply RVDD 594. However, pixel cell 505 may include any of a variety of alternative pixel cell architectures, according to different embodiments, in which some source follower transistor is coupled to a floating diffusion node, the source follower transistor to provide an amplification signal for determining an output of the pixel cell.

Pixel cell 505 may, for example, represent a variation on the architecture of pixel cell 305 which does not include any row (or column) select transistor to provide functionality such as that of select transistor 350. By way of illustration and not limitation, the various functionalities of PD 515, transfer transistor 510, reset transistor 520, source follower transistor 540, TX 590, RST 592, and RVDD 594 may correspond, respectively, to the various functionalities of PD 315, transfer transistor 310, reset transistor 320, source follower transistor 340, TX 390, RST 392, and RVDD 394. However, in pixel array 505, an amplification signal from transistor 540 may be provided directly to BL 562 as the analog output signal of pixel cell 505.

To reduce pixel readout signal noise, certain embodiments variously provide an arrangement of elements in image sensor 500 to increase parasitic capacitance between BL 562 and one or more other traces. By way of illustration and not limitation, image sensor 500 may include first trace T1 564, some segment of which is to remain at a particular voltage level at least throughout a time period during which BL 562 receives an output signal from pixel cell 505. In an embodiment, T1 564 is coupled to a ground voltage, for example. In another embodiment, T1 564 is coupled to a power supply (e.g. SVDD 560 or RVDD 594), where a voltage level of such a power supply is to remain constant while an output signal is provided from pixel cell 505.

The illustrative embodiment of FIG. 5 shows a first segment of T1 564 and a second segment BL 562 in a region of image sensor 500 where no other trace is positioned between T1 564 and BL 562. Accordingly, T1 564 and BL 562 may be said to neighbor one another—e.g. at least due to the arrangement shown in the illustrated region of image sensor 500. Such a first segment of T1 564 may extend in parallel to the second segment of BL 562. In turn, that same second segment of BL 562 may neighbor, and extend in parallel to, some third segment of SVDD 560 which neighbors the second segment of BL 562. SVDD 560, BL 562 and T1 564 are not shown to scale, and may vary at least according to their respective widths and/or their various separations from one another.

The arrangement of elements to increase parasitic capacitance of BL 562 may include each of the above-described first segment, second segment and third segment being substantially within a maximum distance of a respective neighboring other one of the first segment, second segment and third segment. In one embodiment, a maximum distance may be an absolute value. By way of illustration and not limitation, for each of the first segment, the second segment and the third segment, the segment in question may be substantially within 0.2 micrometers of a respective neighboring other one of the first segment, the second segment and the third segment. For example, a smallest distance 580 between the respective segments of SVDD 560 and BL 562 may be substantially no greater than 0.2 micrometers, and a smallest distance 585 between the respective segments of BL 562 and T1 564 may be substantially no greater than 0.2 micrometers.

In one embodiment, a maximum proximity may be a relative value which is based upon one or more dimensions of image sensor 500. By way of illustration and not limitation, the smallest distance 585 between the first segment of T1 564 and the second segment of BL 562 may be substantially equal to a width 576 of the first segment. Alternatively or in addition, the smallest distance 580 between the second segment of BL 562 and the third segment of SVDD 560 may be substantially equal to width 572 of the third segment. In an embodiment, distances 580, 585 are substantially equal to one another—e.g. where widths 572, 576 are substantially equal to one another. Additionally or alternatively, widths 572, 574 and 576 may all be substantially equal to one another, although certain embodiments are not limited in this regard. The segments of traces 572, 574 and 576 shown in FIG. 5 may be aligned with one another in a single common metal layer, for example. In an alternate embodiment, the segments of traces 572, 574 and 576 shown in FIG. 5 may be in different respective metal layers of a metal stack—e.g. where such segments are aligned with one another on adjacent metal layers.

Figure 6:
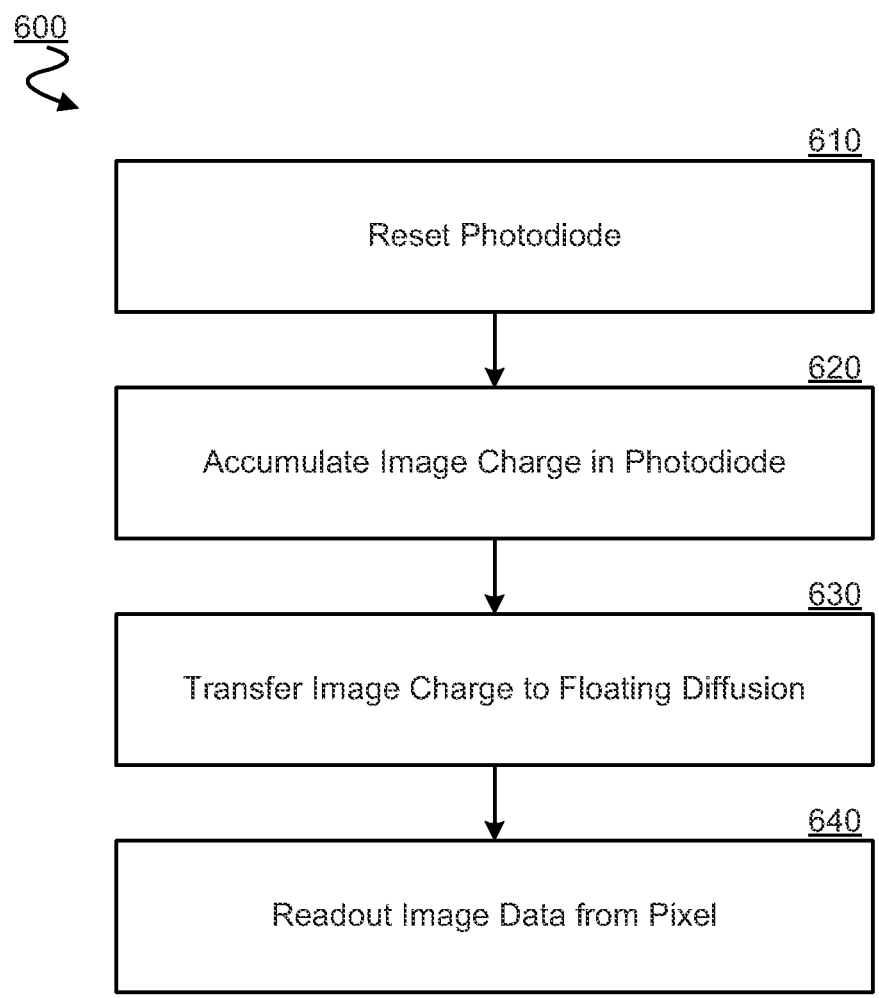
FIG. 6 is a flow diagram illustrating elements of a method for operating a pixel cell of an image sensor according to an embodiment.

FIG. 6 is a flow chart illustrating elements of process 600 for operating a pixel cell in accordance with an embodiment. Process 600 may implement operation of pixel cell 305, for example. In an embodiment, process 600 may be sequentially or concurrently executed with multiple respective pixels in pixel array 204—e.g. depending upon whether a rolling shutter or global shutter is used. The order in which some or all of the process blocks appear in process 600 should not be deemed limiting. Rather, one of ordinary skill in the art having the benefit of the present disclosure will understand that some of the process blocks may be executed in a variety of orders not illustrated.

In a process block 610, a photodiode (e.g., photodiode region PD 315) may be reset. Resetting may include discharging or charging photodiode to a predetermined voltage potential. Such reset may be achieved by asserting both a reset signal and a transfer signal—e.g. reset signal RST to enable reset transistor 320 and transfer signal TX to enable transfer transistor 310. Enabling a reset transistor and transfer transistor of the pixel cell may electrically couple the photodiode and a floating diffusion node of the pixel cell to a reset power line—e.g. power rail RVDD.

After the photodiode is reset, image acquisition by the photodiode may commence, at process block 620. For example, the reset signal and/or the transfer signal may be de-asserted to electrically isolate the photodiode for charge accumulation therein. In an embodiment, light incident on the pixel cell may be focused by a microlens and/or pass through a color filter layer onto the photodiode region. Such a color filter may operate to filter the incident light into component colors (e.g., using a Bayer filter mosaic or color filter array). The incident photons may cause charge to accumulate within the photodiode.

Once the image acquisition window has expired, the accumulated charge within the photodiode may, at process block 630, be transferred to the floating diffusion node—e.g. by asserting a transfer signal to the gate of the transfer transistor. In the case of a global shutter, the global shutter signal may be asserted simultaneously, as the transfer signal, to all pixels within pixel array 204 during process block 620. This may result in a global transfer of the respective image data accumulated by each pixel into the pixel's corresponding floating diffusion—e.g. FD 330.

Once the image data is transferred, the transfer signal may be de-asserted to isolate the floating diffusion node from the photodiode, in preparation for a readout of image data from the pixel cell at process block 640. In an embodiment, the readout at block 640 may include a voltage of the floating diffusion node activating a source follower transistor (e.g. transistor 340) coupled thereto. In various embodiments, readout may occur on a per row basis via column lines, on a per column basis via row lines, on a per pixel basis, or by other logical groupings. Once the image data of all pixels has been readout, process 600 may, in an embodiment, return to process block 610 to prepare for the next image.

Techniques and architectures for image sensing are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. An image sensor device comprising:
    a pixel array including a pixel cell comprising a source follower transistor;
    a first trace comprising a first segment to remain at a first voltage level throughout a time period;
        a bit line trace coupled to the pixel cell, the bit line trace comprising a second segment which neighbors, and extends parallel to, the first segment, the bit line trace to receive an analog signal output from the pixel cell during the time period, the analog signal based on an amplification signal, wherein the pixel cell further comprises a select transistor, wherein the source follower transistor is coupled to the bit line trace via the select transistor; and a source follower power trace coupled to the pixel cell, the source follower power trace comprising a third segment which neighbors, and extends parallel to, the second segment, wherein the image sensor device comprises a metal layer which includes the first segment, the second segment and the third segment, the source follower power trace to provide a second voltage level to the source follower transistor, wherein the source follower transistor to provide the amplification signal based on the second voltage level.

2. The image sensor device of claim 1, wherein for each of the first segment, the second segment and the third segment, a smallest separation between the segment and the respective neighboring other one of the first segment, the second segment and the third segment is substantially equal to or less than 0.2 micrometers.

3. The image sensor device of claim 1, wherein the first voltage level is a ground voltage level.

4. The image sensor device of claim 1, wherein the first voltage level is a supply voltage level provided to the pixel cell.

5. The image sensor device of claim 1, wherein the pixel array includes a backside illumination pixel array.

6. An image sensor device comprising:
a pixel array including a pixel cell comprising a source follower transistor;
a first trace comprising a first segment to remain at a first voltage level throughout a time period;
a bit line trace coupled to the pixel cell, the bit line trace comprising a second segment which neighbors, and extends parallel to, the first segment, the bit line trace to receive an analog signal output from the pixel cell during the time period, the analog signal based on an amplification signal, wherein the pixel cell further comprises a select transistor, wherein the source follower transistor is coupled to the bit line trace via the select transistor; and
a source follower power trace coupled to the pixel cell, the source follower power trace comprising a third segment which neighbors, and extends parallel to, the second segment, wherein the image sensor device comprises a metal layer which includes the first segment, the second segment and the third segment, the source follower power trace to provide a second voltage level to the source follower transistor, wherein the source follower transistor to provide the amplification signal based on the second voltage level;
wherein a smallest separation between the first segment and the second segment is substantially equal to each of a width of the first segment, a smallest separation between the second segment and the third segment, and a width of the third segment.

7. The image sensor device of claim 6, wherein a width of the second segment is substantially equal to the width of the first segment.

8. The image sensor device of claim 6, wherein the first voltage level is a ground voltage level.

9. The image sensor device of claim 6, wherein the first voltage level is a supply voltage level provided to the pixel cell.

* * * * *